(12) United States Patent
Frisch

(10) Patent No.: US 6,882,538 B1
(45) Date of Patent: Apr. 19, 2005

(54) INTELLIGENT POWER MODULE

(75) Inventor: Michael Frisch, Munich (DE)

(73) Assignee: Tyco Electronics Logistics AG, (CH)

( * ) Notice: Subject to any disclaimer, the term of this patent is extended or adjusted under 35 U.S.C. 154(b) by 0 days.

(21) Appl. No.: 09/980,384

(22) PCT Filed: May 31, 2000

(86) PCT No.: PCT/EP00/05021

§371 (c)(1),
(2), (4) Date: May 2, 2002

(87) PCT Pub. No.: WO00/74446

PCT Pub. Date: Dec. 7, 2000

(30) Foreign Application Priority Data

| May 31, 1999 | (DE) | 199 24 991 |
|---|---|---|
| May 31, 1999 | (DE) | 199 24 994 |

(51) Int. Cl.[7] .............................. H05K 7/02; H05K 7/20
(52) U.S. Cl. ................. 361/728; 361/752; 361/720; 361/715; 361/704; 361/707; 361/760; 361/795; 174/260; 174/252
(58) Field of Search ............................ 361/728, 730, 361/749, 761, 795, 792, 707, 726, 719, 715, 361/720, 704, 760, 752; 174/250, 254, 255, 174/260, 261, 252; 257/678

(56) References Cited

U.S. PATENT DOCUMENTS

| 4,306,275 A | 12/1981 | Miura |
| 4,495,546 A | 1/1985 | Nakamura et al. |
| 5,266,746 A | 11/1993 | Nishihara et al. |
| 5,345,205 A * | 9/1994 | Kornrumpf .................. 333/246 |
| 5,452,182 A * | 9/1995 | Eichelberger et al. ...... 361/749 |
| 5,484,965 A | 1/1996 | Woychik |
| 5,488,256 A | 1/1996 | Tsunoda |
| 5,513,072 A * | 4/1996 | Imaji et al. .................. 361/707 |
| 5,521,437 A * | 5/1996 | Oshima et al. ............. 257/701 |
| 5,747,875 A * | 5/1998 | Oshima ...................... 257/687 |
| 5,835,358 A | 11/1998 | Brakus |
| 5,942,797 A | 8/1999 | Terasawa |
| 6,005,366 A * | 12/1999 | Majumdar et al. .......... 318/811 |
| 6,201,701 B1 * | 3/2001 | Linden et al. .............. 361/720 |

FOREIGN PATENT DOCUMENTS

| DE | 3813566 | 11/1989 |
| DE | 4236268 | 5/1993 |
| EP | 0463589 | 1/1992 |
| EP | 708583 | 4/1996 |
| EP | 0751570 | * 2/1997 |
| JP | 02148759 | 6/1990 |
| JP | 02281790 | 11/1990 |
| JP | 03069185 | 3/1991 |

* cited by examiner

Primary Examiner—Kamand Cuneo
Assistant Examiner—Dameon E. Levi
(74) Attorney, Agent, or Firm—Baker & Daniels

(57) ABSTRACT

The power part and the logic part of the module are arranged on different substrates. The circuit board (5) of the logic part has a recess (6) in which the power substrate (2) is located and electrically connected to the logic part by wire bonding techniques (7).

6 Claims, 2 Drawing Sheets

INTELLIGENT POWER MODULE

The invention relates to an intelligent power module, in particular in sandwich construction.

IPM (intelligent power module) structures, i.e. modules having a power part with electronic components and a logic or control part integrated in the module, are utilized presently, for example, for applications in connection with welding apparatus, power supplies and in motive power engineering. Especially in the field of asynchronous motors, frequency converter solutions are employed for speed control in increasing manner, with the power part of the module making use in particular of IGBT (insulated-gate bipolar transistor) power semiconductors.

In selecting the power substrate as carrier for the components of the power part, care is to be taken that on the one hand high electrical insulation and on the other hand also good heat transfer is ensured towards the usually required cooling plate. The latter is not obtained with the known circuit boards of plastics material, so that the power parts, depending on the particular application requirements, presently are mounted on relatively complex substrates, for example DCB (direct copper bonding) aluminum oxide, IMS (aluminum polyimide copper) or aluminum nitrite. On the other hand, the logic parts may easily be manufactured on the basis of the conventional epoxy circuit boards.

Problematic with the conventional modular technology is the connection between the logic part and the power part. This connection, which typically makes use of solder contacts, pluggable connections or pressure contacts, frequently is a weak point in terms of quality and causes high costs. The problems become even greater with the connecting technology if, for reasons of space, a sandwich-type construction of the module is demanded by the user in which, for example, the power substrate is connected via pins to the logic part arranged thereabove, as it is known e.g. from EP 0 463 589 A2. Such logic power modules in sandwich construction are already available in the market.

The patent specification U.S. Pat. No. 4,495,546 already reveals a sandwich structure which, however, is not concerned with power modules, but with two thick film circuits having aluminum substrates which are both covered by a flexible circuit board which, moreover, forms between the two circuit parts a flexible intermediate section that is bent by 180° in order to constitute the sandwich structure. Due to the fact that not only the intermediate section to be bent, but the circuit board in its entirety is flexible, polyimide—which is known as material for flexible circuit boards—is suggested, which however is relatively expensive.

The document WO96/13966 discloses a module comprising power and logic components that are integrated on a substrate. The power semiconductors are electrically connected to the substrate by thick wire. The substrate is then integrated in a system circuit board and connected thereto by means of soldered terminal pins. The terminal pins are capable of compensating the differing thermal expansion of substrate and circuit board. A disadvantage consists in that all components of the module are mounted on the expensive power substrate and that the connection of the module to the system circuit board is very complex.

It is an object of the invention to make available an intelligent power module, in particular in sandwich construction, which does not require expensive connecting techniques and thus can be manufactured easily.

According to the invention, this is achieved by an intelligent power module comprising the features indicated in claim 1.

The power module consists of a power part whose electronic components are arranged on a power substrate, and of a logic part whose components are arranged on a circuit board or multilayer circuit board. The separation of logic components and power components provides the advantage that an inexpensive circuit board can be used for the logic part and that only a small, expensive, powerful power substrate is necessary.

The circuit board has a recess in which the power substrate is located and electrically connected to the logic part. This connection by means of thick AL wire can be established inexpensively in integral manner.

The power substrate itself as well as the portions of the circuit board surrounding the power substrate are mounted on a cooling plate.

In a first embodiment of the invention, however, at least a strip portion is left free along a side of the circuit board. The circuit board has contact pads on this side, by means of which the module can be soldered directly in the slot-like opening of a system circuit board. In a second embodiment, the circuit board is in the form of a multilayer board having a laminate construction of conductively coated layers whose carrier material consists of a glass fiber resin fabric each. The multilayer circuit board consists of two parts that are connected by a thin intermediate section in which all lower layers of the multilayer circuit board are not present and the uppermost layer on the side of the components is a bendable continuation in the form of a flexible electrical and mechanical connecting layer between the two parts.

Advantageous developments of the invention are subject matter of dependent claims.

The invention will be elucidated in more detail hereinafter by way of an embodiment with reference to the drawing figures in which FIG. 1 shows a perspective plan view of a first embodiment of a module according to the invention in the state in which the same is not yet soldered into a system circuit board;

Figure 1:
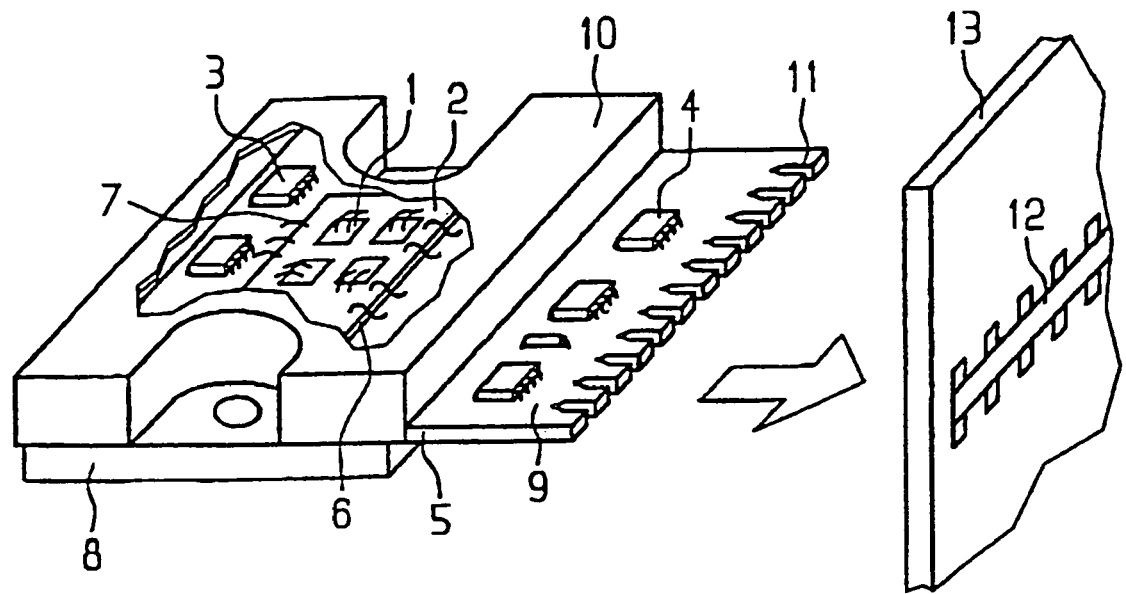

FIG. 1 shows a module which, for example, is suitable for power losses as of 20 W and basically consists of a logic part and a power part. The components 1 of the power part, which mainly comprise power semiconductors, are arranged on a suitable (cf. above) power substrate 2, and in particular are bonded thereto. The components 3 and 4 (ICs and other SMD components) of the logic part are arranged on a circuit board 5 of conventional material, which has a recess 6 of the size of the power part. The power substrate 2 arranged in the recess 6 is connected by bonding wires 7 to the surrounding portions of the circuit board 5. A complex connecting technique, e.g. by means of contact combs, thus is avoided at this location. The circuit board that is interrupted initially by the individual recesses only thus can be bonded in integral manner.

The major part of the circuit board 5, together with the power substrate 2 arranged therein, is mounted on a cooling plate 8, for example by means of thermally conductive adhesive or by soldering techniques. The top side of this major part of the circuit board 5 may be covered e.g. by a silicone casting compound 10 for protection of the semiconductor components. Anyway, the strip portion 9 left free from the casting compound 10 and the cooling plate 8, respectively, must be sufficiently wide to permit the formation of contact pads 11 on the circuit board 5 proper as well as the insertion thereof through the opening slot 12 of a second circuit board, in the instant case a system circuit board 13.

Figure 2:
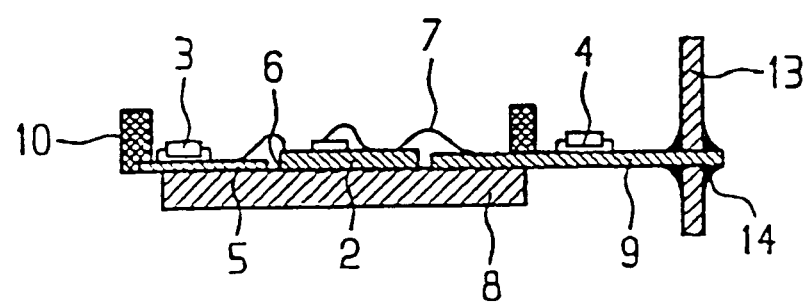
FIG. 2 shows a sectional side view of the same module as in FIG. 1, however in the finished, soldered state.

FIG. 2 shows a flow-soldered module with soldering points 14. Such directly solderable circuit boards indeed have become known recently, but they are not employed in the functional unit of power modules, which typically make use of sturdier constructional elements.

The construction according to the invention on the one hand minimizes the necessary connecting technology, reducing it to bonding and direct soldering in the system circuit board; on the other hand, the horizontal type of construction results in an advantageously flat module. The module may be mechanically locked in a housing (not shown) in particular by way of its cooling plate 8.

Figure 3:
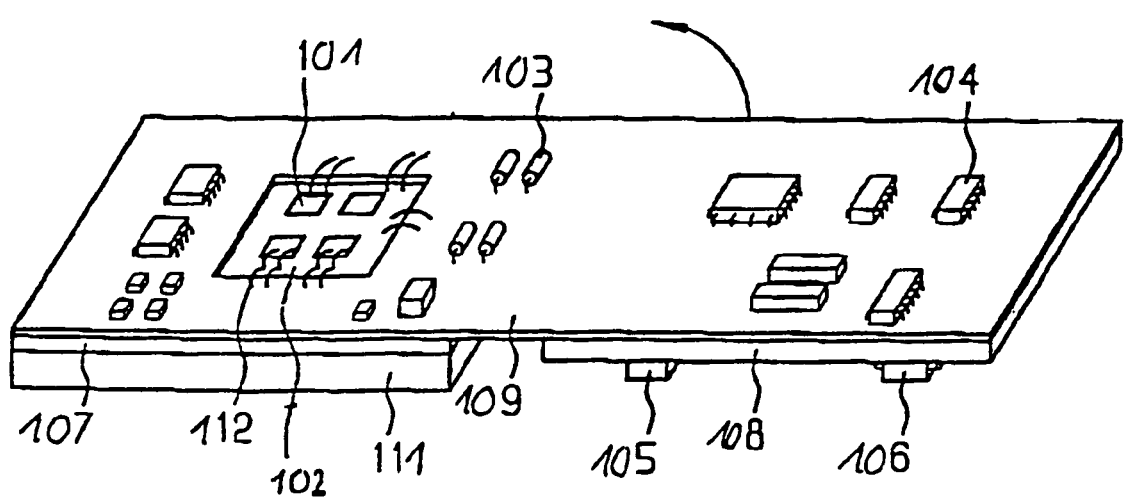
FIG. 3 shows a perspective plan view of a second embodiment of a module according to the invention in the state in which the same is not yet folded together.

FIG. 3 shows a module which, for example, is suitable for power losses as of 20 W and basically consists of a logic part and a power part. The components 101 of the power part are arranged on a suitable (cf. above) power substrate 102. The components 103 to 106 of the logic part are arranged on a multilayer circuit board consisting of two parts 107 and 108, with the first part 107 thereof having a 110 of the size of the power part. The power substrate 102 arranged in the recess 110 is connected via bonding wires 112 to the surrounding portions of the first part 107 of the multilayer circuit board. A complex connecting technique, e.g. by means of contact combs, thus is avoided at this location. The circuit board that is interrupted initially by the individual recesses only thus can be bonded in integral manner.

Due to the arrangement of power part and parts of the logic part in one plane, i.e. beside each other, which is due to the bonding technique, results in an increased requirement of space which may be mitigated by partly shifting the logic part to another plane. This is possible in accordance with the invention again without the necessity of a new, complex connecting technique to said other plane.

The multilayer circuit board, in the intermediate section thereof, is substantially interrupted as regards its property of a carrier, as the two parts 107 and 108 are connected there by a thin connecting layer 109 only. This ensures on the one hand a direct electrical connection between the two parts 107 and 108 without additional connecting technique, whereas on the other hand the mechanical connection between the two parts 107 and 109 is no longer rigid, but flexible. In terms of manufacturing technology, this may be achieved, for example, in that gaps (for the intermediate sections) are integrally stamped such that the multilayer circuit board parts 107 and 108 are connected on webs only. Thereafter, a last, uppermost layer is laminated over the two parts 107 and 108 and over the gap stamped before, with this layer then constituting the intermediate section in the form of a flexible connecting layer 109. This is followed by breaking out of the individual, two-part multilayer circuit boards, mounting of the cooling plates and loading with logic components or insertion of the power substrate into the recess 110 provided.

As regards the carrier material for the layers and thus also for the uppermost connecting layer 109, e.g. conventional copper-coated glass fiber resin fabric with the specification (NEMA grade) FR4 and FR5 is suitable. The glass fiber-like connecting layer 109 with a thickness of approx. 0.3 mm is stable and flexible enough for bending thereof, e.g. about 90 or 180°.

Figure 4:
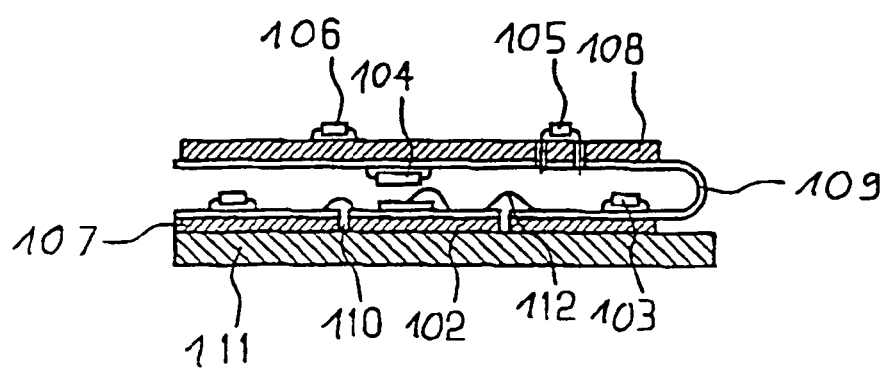
FIG. 4 shows a sectional side view of the same module as in FIG. 3, however in the finished, folded state.

FIG. 4 illustrates a finished sandwich structure of the module according to the invention. This illustration reveals the superimposed parts 107 and 108 of the multilayer circuit board which are approximately of equal size and loaded with SMD components 103 to 105, e.g. ICs or passive components or with pluggably mounted components 106. The first part 107 of the multilayer circuit board, along with the power substrate 102 arranged therein, is mounted on a cooling plate 111, for example by means of thermally conductive adhesive or by soldering techniques. The connection between the power substrate 102 and the first part 107 by wire bonding techniques 112 is visible as well. By continuation of the component-side uppermost layer of part 107, i.e. of the connecting layer 109, the two rigid parts 107 and 108 may be folded about the flexible intermediate piece.

The module may be installed in a housing in particular by way of its cooling plate 111, and in this respect the upper part 108 advantageously may be mechanically locked to the housing as well. The upper part 108 is usually provided with terminals constituting the mains terminals of the module as well as the terminals to the unit driven or controlled. The module may also be connected in addition to a system circuit board.

What is claimed is:

1. An intelligent power module comprising a power part of the electronic components of which are arranged on a power substrate, and a logic part of the components of which are arranged on a circuit board having a recess in which said power part is located and electrically connected to the logic part by means of wire bonding techniques, said power substrate being mounted on a cooling plate, wherein a first portion of said circuit board is mounted on and in thermal connection with the cooling plate, the first portion surrounding said power substrate and a second portion of said circuit board supporting at least one component forming said logic part which is not mounted on the cooling plate.

2. An intelligent power module according to claim 1, wherein at least a strip portion along a side of the circuit board is left free and is not mounted on said cooling plate.

3. An intelligent power module according to claim 1, wherein the circuit board has contact pads on said side by means of which the module can be soldered directly in the slot-like opening of a system circuit board.

4. An intelligent power module according to claim 1, wherein the components of the logic part are arranged on a multilayer circuit board having a recess in which said power part is located and electrically connected to said logic part, and characterized in that the multilayer circuit board has a laminate structure of conductively coated layers whose carrier material consists of a glass fiber resin fabric each, and in that the multilayer circuit board consists of two parts connected by a thin intermediate section in which all lower layers of the multilayer circuit board are not present and only the component-side uppermost layer is present as a bendable continuation in the form of a flexible, electrical and mechanical connecting layer between said two parts.

5. An intelligent power module according to claim 4, characterized in that the flexible connecting layer is bent by 180° so that said two parts continue in bendable manner.

6. An intelligent power module according to claim 5, characterized in that the first part of the multilayer circuit board, which has the recess, as well as the second, folded up part are approximately of equal size, that said first part is mounted on a cooling plate that is larger than the power substrate area, and in that the electrical connections between said power substrate and the first part of the multilayer circuit board are established by means of wire bonding techniques.

* * * * *